(12) United States Patent
Ghilardelli

(10) Patent No.: US 6,275,099 B1
(45) Date of Patent: Aug. 14, 2001

(54) HIGH-VOLTAGE PUMP ARCHITECTURE FOR INTEGRATED ELECTRONIC DEVICES

(75) Inventor: Andrea Ghilardelli, Cinisello Balsamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/239,908

(22) Filed: Jan. 29, 1999

(30) Foreign Application Priority Data

Jan. 30, 1998 (IT) .............................. TO98A0077

(51) Int. Cl.[7] .................. G06F 1/10; G06F 3/02
(52) U.S. Cl. ..................... 327/540; 327/536; 327/589
(58) Field of Search .................... 327/536, 537, 327/540, 589; 363/60

(56) References Cited

U.S. PATENT DOCUMENTS

| | | | |
|---|---|---|---|
| 5,077,691 | 12/1991 | Haddad et al. ................ | 365/218 |
| 5,699,018 | * 12/1997 | Yamamoto et al. ............ | 327/536 |
| 5,732,039 | * 3/1998 | Javanifard et al. ............ | 327/536 |
| 5,796,293 | * 8/1998 | Yoon et al. ..................... | 327/536 |
| 5,812,017 | * 9/1998 | Golla et al. .................... | 327/536 |
| 6,011,743 | * 1/2000 | Khang .......................... | 327/536 |

OTHER PUBLICATIONS

Kawahara et al., "Bit–Line Clamped Sensing Multiplex and Accurate High Voltage Generator for Quarter–Micron Flash Memories," *IEEE Journal of Solid–State Circuits*, 31(11):1590–1600, Nov. 1996.

Tanzawa and Tanaka, "A Dynamic Analysis of the Dickson Charge Pump Circuit," *IEEE Journal of Solid–State Circuits*, 32(8):1231–1240, Aug. 1997.

* cited by examiner

*Primary Examiner*—Timothy P. Callahan
*Assistant Examiner*—Quan Tra
(74) *Attorney, Agent, or Firm*—Theodore E. Galanthay; E. Russell Tarleton; Seed IP Law Group, PLLC

(57) ABSTRACT

An integrated electronic device having a first charge pump, intended to drive a first line having a high capacitive load, and a second charge pump having a high current pumping capacity and intended to drive a second line, a controlled switch is interposed between the outputs of the two pumps, such as to connect the output of the high current capacity pump to the first line, to charge the first line quickly to the preset voltage, without the first charge pump being oversized. When the voltage present on the first line becomes greater than the voltage at the output of the second charge pump, owing to the current required by the second line, the switch is opened. A common phase generator which drives both the pumps is also provided.

16 Claims, 2 Drawing Sheets

HIGH-VOLTAGE PUMP ARCHITECTURE FOR INTEGRATED ELECTRONIC DEVICES

TECHNICAL FIELD

The present invention relates to a high-voltage pump architecture for integrated electronic devices.

BACKGROUND OF THE INVENTION

As known, devices required to internally generate a plurality of high voltages through charge pumps, such as in flash memories, at present comprise separate-unit pumps, which are virtually independent from each other. This does not permit efficient optimization of the device resources.

In particular, since the dimensions of the charge pumps are dependent, inter alia, on the current capacity they should supply, at present only a pump with a high current capacity is produced, which however functions intermittently, and the pumps supplying high output voltages to nodes with a high capacitive load are undersized, such that charging of the respective nodes is slow. In addition, the phase signal generation circuits necessary for the operation of the various pumps are replicated for each pump, thus giving rise to a large consumption of space and current, and a high level of noise.

SUMMARY OF THE INVENTION

The object of the present invention is to provide an architecture that optimizes management of the charge pumps in electronic devices provided with a plurality of pumps in order to improve the efficiency, the consumption, the area occupied, and the setting speed of the high voltages.

According to the present invention, an integrated electronic device is provided, as defined in the attached claims having in one embodiment at least a first charge pump, having a first output connected to a first node, and a second charge pump having a second output connected to a second node; the first charge pump having a first current capacity and the second charge pump having a second current capacity greater than the first current capacity, and a controlled switch interposed between the first output and the second output.

BRIEF DESCRIPTION OF THE DRAWINGS

The invention is now described with reference to the attached drawings, which illustrate non-limiting embodiments, wherein.

DETAILED DESCRIPTION OF THE INVENTION

Figure 1:
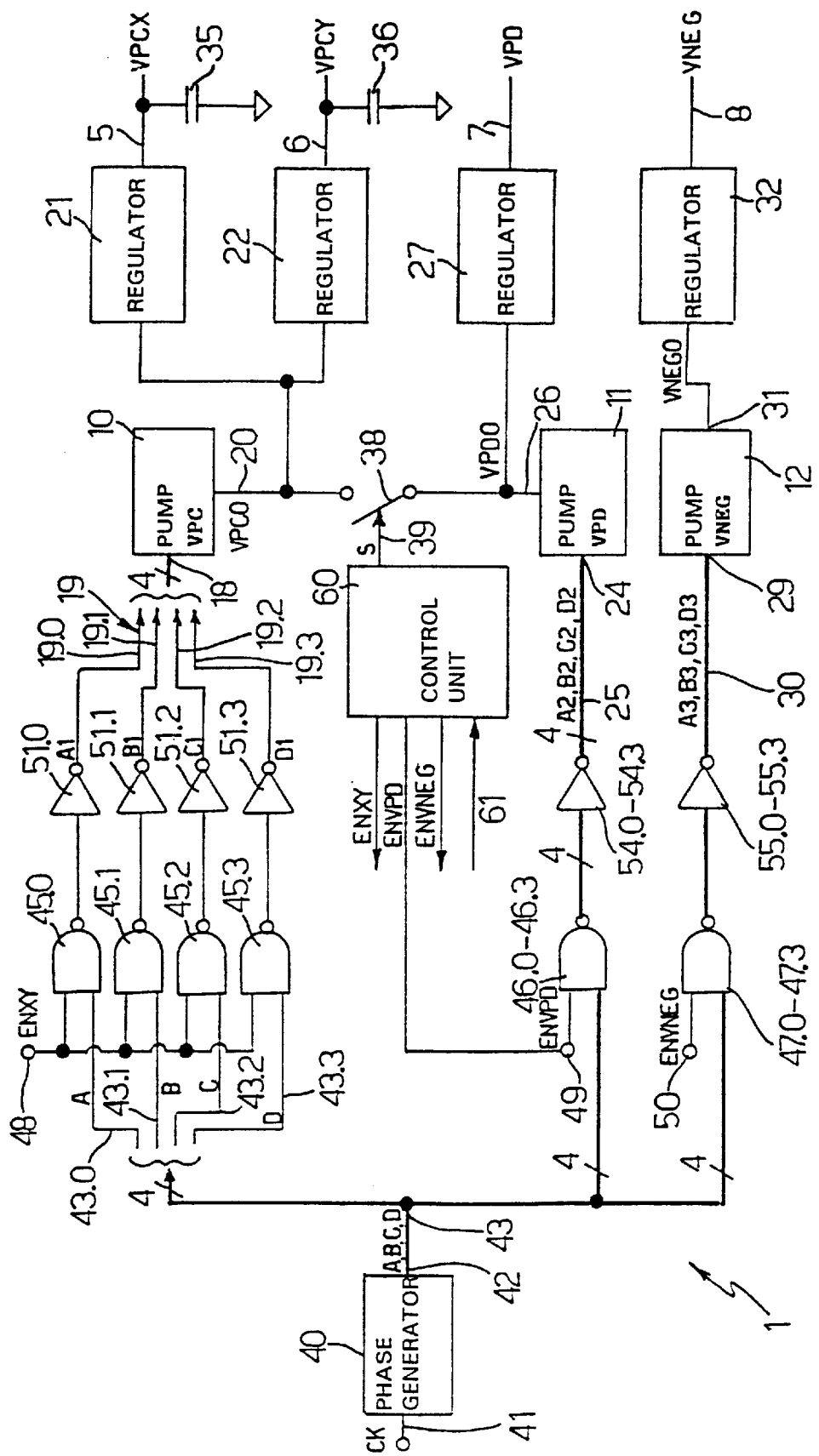
FIG. 1 shows a block diagram of an embodiment of the present invention.

FIG. 1 shows by way of example a possible implementation of the present invention, in the case of an electronic device 1 (for example a flash memory) wherein four different voltages should be generated, i.e., a voltage VPCX, supplied on a line 5, for biasing word lines of the memory array (not shown); a voltage VPCY, supplied on a line 6, for biasing bit lines; a voltage VPD, supplied on a line 7, for biasing components (not shown) requiring at least intermittently a high current; and a voltage VNEG, supplied on a line 8, for generating a negative voltage (negative potential relative to ground, for example for cell erasing, to be supplied to the word lines).

The illustrated example shows only the parts of device 1 related to the present invention. Device 1 comprises three charge pumps, and specifically a pump VPC 10 with a limited current capacity, and thus reduced dimensions, consumption and noise, a pump VPD 11 with a high current capacity (and thus dimensions, consumption and noise greater than pump VPD 11), and a pump VNEG 12, supplying a negative voltage.

Pump 10 has an input 18 connected to a bus 19 formed by four lines, as explained in greater detail hereinafter, and an output 20 supplying a voltage VPCO and connected to lines 5 and 6 through respective regulators 21 and 22; pump 11 has an input 24 connected to a bus 25 formed by four lines, and an output 26 supplying a voltage VPDO and connected to line 7 through a regulator 27; pump 12 has an input 29 connected to a bus 30 formed by four lines, and an output 31 supplying a voltage VNEGO and connected to line 8 through a regulator 32. Lines 5 and 6 are high-capacity lines (connected to nodes with a high load capacity), as shown in the figure by respective capacitors 35 and 36.

A controlled switch 38 has a control terminal 39 receiving a control signal S and connects outputs 20 and 26 of pumps VPC 10 and VPD 11, as described in detail hereinafter.

The device 1 additionally comprises a phase generator 40, having an input 41, receiving a clock signal CK, and an output 42, connected to a bus 43, formed by four lines each supplying a respective input phase signal A, B, C and D. Device 1 additionally comprises a plurality of NAND gates 45.0–45.3, 46.0–46.3 and 47.0–47.3. In detail, each gate 45.0–45.3 has a first input connected to an input node 48 receiving an enabling signal ENXY, and a second input connected to a respective line 43.0–43.3 belonging to bus 43. Each NAND gate 45.0–45.3 thus receives a respective input phase signal A–D, and the first enabling signal ENXY, and is connected at its output to a respective inverter 51.0–51.3 supplying at the output a respective first pump phase signal A1, B1, C1, D1, which is supplied to lines 19.0–19.3 forming bus 19.

Similarly, as shown only schematically in FIG. 1, gates 46.0–46.3 have two inputs, i.e., a first input connected to an input node 49 and receiving a second enabling signal ENVPD, and a second input connected to a respective bus line 43 and receiving a respective input phase signal A–D. Gates 46.0–46.3 have outputs connected to respective inverters 54.0–54.3, which generate at the output respective second pump phase signals A2, B2, C2, D2 supplied to bus 25. Similarly the gates 47.0–47.3 have two inputs, i.e., a first input connected to an input node 50 and receiving a third enabling signal ENVNEG, and a second input connected to a respective line of bus 43 and receiving a respective input phase signal A–D. NAND gates 47.0–47.3 are also connected at their output to respective inverters 55.0–55.3, generating third respective pump phase signals A3, B3, C3, D3 on bus 30.

Finally, device 1 comprises a control unit 60 supplying signals S, ENXY, ENVPD, ENVNEG, as described hereinafter. Control unit 60 has an input 61 receiving further signals supplied by the device 1 and necessary for activating and deactivating pumps 10–12.

The device 1 uses the high current capacity of pump VPD 11 to charge lines 5 and 6 with a high load capacity, by connecting the outputs 20 and 26 of pumps VPC 10 and VPD 11. In particular, when the device 1 is switched on, lines 5 and 6 should still be charged, and line 7 does not require current, or requires a limited quantity, control unit 60 closes switch 38, such as to connect the output 26 of pump VPD 11 to the output 20 of pump VPC, and thus to the input of regulators 21 and 22. Thereby, pump VPD 11 supplies a high current to output 26, thus permitting rapid charging of lines 5, 6, much faster than by single pump VPC 10 (which, as already stated, has dimensions which are much smaller than those of pump VPD 11).

Figure 2:
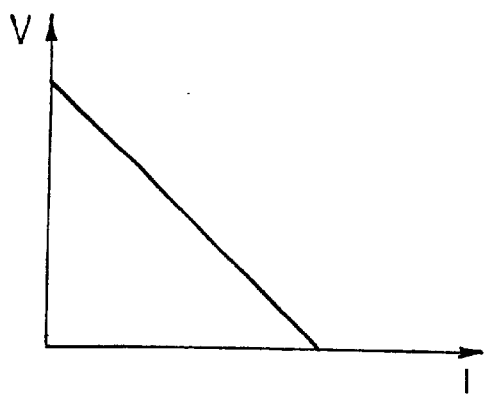
FIG. 2 shows the relationship between the supplied current capacity and the output voltage of a charge pump.

When, for the operation of the device 1, it is necessary for a high current to be supplied to line 7, the connection between outputs 26 and 20 is interrupted, by opening switch 38. Indeed, as known, in positive charge pumps, there is a linear, negative coefficient relationship between supplied-current and output voltage, as shown in FIG. 2. As known, as the supplied current by the charge pump increases, the output voltage of the pump decreases. Consequently, when line 7 requires a high current to be supplied, voltage VPDO correspondingly decreases at output 26 of pump 11. When the device 1 is in this condition, before voltage VPDO drops below VPCX and VPCY, control unit 60 opens switch 38, thus generating an appropriate level of signal S. Thereby, pump VPC 10 sees lines 5 and 6 already at the required value, and thus does not need to supply them with a large current, but simply the current which is necessary to maintain the required value VPCX and VPCY; in general this current is low, and is equivalent only to the leakage current, if there are no consuming loads on lines 5 and 6. In this condition, pump VPD 11 can supply the high current required on line 7.

Thereby, the size of pump VPC 10 can be such as to guarantee only the charge required to maintain the set level, after this level has been reached, and this allows pump VPC 10 to have a very small size.

Figure 3:
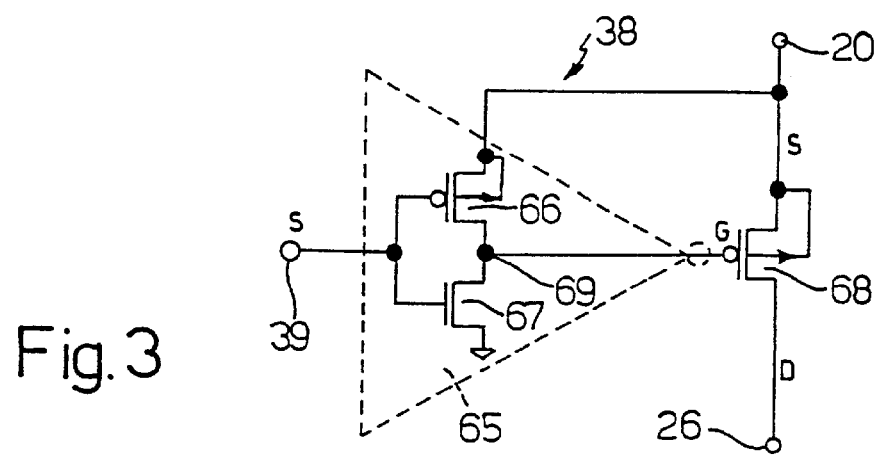
FIG. 3 illustrates the circuit diagram of a detail of FIG. 1.
Figure 4:
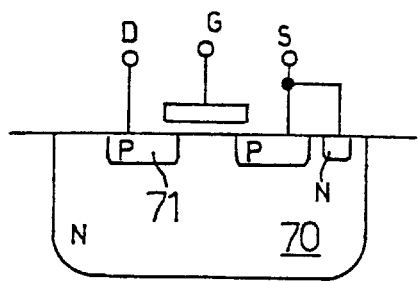
FIG. 4 shows the implementation of a component of the detail in FIG. 3.
Figure 5:
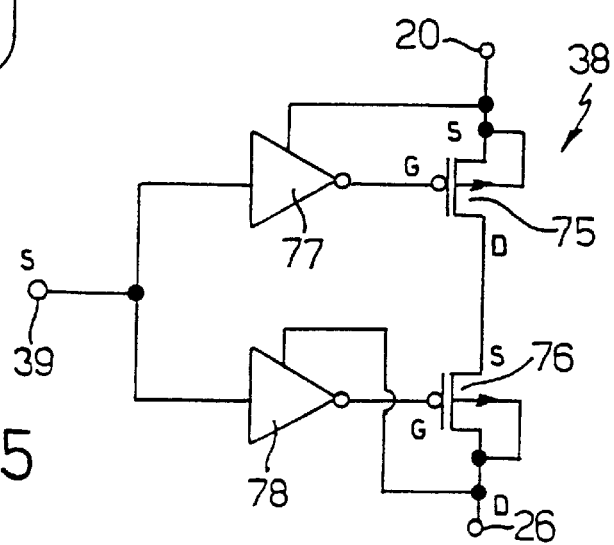
FIG. 5 shows the circuit diagram of a different embodiment of the same detail of FIG. 1 shown in FIG. 3.

FIGS. 3–5 show two possible implementations of switch 38.

According to FIG. 3, switch 38 comprises an inverter 65 formed from a pair of driving transistors 66, 67, respectively of PMOS and NMOS type, and a pass transistor 68 of PMOS type. In detail, driving transistor 66 has source terminal connected to node 20, gate terminal connected to the gate terminal of driving transistor 67 and to node 39, and drain terminal (defining a node 69) connected to the drain terminal of driving transistor 67. The latter has source terminal connected to ground. Pass transistor 68 has source terminal S connected to node 20, gate terminal G connected to node 69, drain terminal D connected to node 26, and well region connected to source terminal S.

The switch 38 of FIG. 3 is off (pass transistor 68 on) when signal S is high, and vice versa; this arrangement can be used when voltage VPCO at node 20 continues to be greater than, or equal to, voltage VPDO at node 26; this condition represents a usual operating condition of device 1, since output 26 of pump VPD 11 follows the law shown in FIG. 2. When the above condition is not true, switch 38 cannot be used, since on the one hand it is not ensured that pass transistor 68 would be switched off (gate terminal G would be maintained by driving transistor 66 at the same potential as node 20, lower than node 26), and on the second hand the well region of pass transistor 68 (indicated at 70 in the schematic cross-section of FIG. 4, showing the implementation of pass transistor 68), would have a potential lower than drain region 71, thus biasing directly the drain-well diode.

This condition can occur for example if, after switch 38 switches off, line 7 does not require current, and on the other hand at least one of lines 5 or 6 requires current from pump VPC 10.

In this condition, it is advantageous to use the embodiment shown in FIG. 5, wherein switch 38 comprises two pass transistors 75, 76 of PMOS type, connected in series between nodes 20 and 26, and controlled by respective inverters 77, 78. In detail, pass transistor 75 has source terminal and well region connected to node 20, gate terminal connected to the output of inverter 77, and drain terminal connected to the source terminal of pass transistor 76; pass transistor 66 has gate terminal connected to the output of inverter 78, and drain terminal and well region connected to node 26. Inverters 77, 78 have the same structure as inverter 65 of FIG. 3, wherein the upper driving transistor of inverter 77 (corresponding to driving transistor 66 of FIG. 3) is connected to node 20, and the upper driving transistor of inverter 78 is connected to node 26.

Thereby, when input signal S is low, and the output of inverters 77, 78 is high, both when the potential of node 20 is greater than that of node 26, and in the opposite case, pass transistors 75 and 76 are surely off, and there are no parasitic diodes directly biased, thus guaranteeing reliably opening of switch 38.

According to an aspect of the present invention, phase generator 40 is shared by all pumps 10, 11, 12. Indeed, it is known that each charge pump needs some timed signals (phase signals), usually two or four. In known circuits, separate circuits are thus provided for generating the phase signals for each pump; these circuits together thus require a large amount of space, and consume a large amount of current. In addition, the different pumps in a device usually have the same structure, and thus require the same phase signals, timed in the same manner. In some cases, on the basis of the structure of the pumps, the same phase signals can actually be used both for the positive pumps and for the negative pumps.

In the latter case, considered in the diagram of FIG. 1, as illustrated, a single phase generator 40 is provided, which generates the four input phase signals A, B, C, D from a single clock CK. Moreover, as illustrated in detail for pump VPC 10, each phase signal has its own inverter 51.0–51.3, operating as a driving circuit which can supply high currents. Indeed each phase signal should drive large capacities (forming the charge pump), and the separation of the driving circuits for each pump phase signal A1–A3, B1–B3, C1–C3, D1–D3 supplied to pumps 10–12, guarantees that the circuits are well-buffered.

Since also the inverters 51.0–51.3, 54.0–54.3, 55.0–55.3 consume a substantial amount of current (because they must drive large capacitive loads), they are deactivated by enabling signals ENXY, ENVPD, ENVNEG, if the respective pump should not function. Consequently, according to the needs of device 1 communicated to the control unit 60 through input 61, the control unit generates suitable levels for the enabling signals ENXY, ENVPD, ENVNEG, setting them to "1" only if the respective pump 10–12 must be activated.

The described device has the following advantages. Firstly, it has smaller dimensions than devices which use independent pumps, and guarantees faster response times. In fact, as stated, the possibility of charging initially nodes with a high voltage through the pump, at the maximum current capacity provided, makes it possible firstly to speed up the initial charging of the nodes with a high voltage, without the corresponding pump being oversized, and secondly, to reduce also the dimensions of the specific pump for the nodes with a high voltage, to the value necessary solely to maintain the charge already reached. A further reduction of dimensions is obtained because the various pumps share the phase generator, thus saving the space which was previously necessary for duplication of this stage.

The optimization associated with the reduction of number and size of the components makes it possible to reduce also the associated consumption of current, and the noise produced by the components, which, for the components concerned, is not negligible. A further reduction in consumption and noise is obtained by the possibility of deactivating the driving inverters of the various phases supplied to the pumps, if the pump itself is inactive.

Finally, it is apparent that modifications and variants can be made to the architecture described and illustrated here, without departing from the scope of the present invention, as defined in the attached claims. For example, control unit 60 can be a separate element, for example a dedicated logic unit for pump management or can be part of the central control unit of device 1; it can be program controlled, or it can be made as a state machine. The control logic of switch 38 can also vary from that described; for example, after opening, as a result of current distribution by pump VPD 11, if line 7 no longer requires current, and voltage VPDO increases once more, unit 60 can close switch 38 once more. In addition, inverters 65, 77 and 78 can be made in any way, for example through a level translator supplied via node 20 or 26 and receiving control signal S.

What is claimed is:

1. An integrated electronic device comprising at least a first charge pump, having a first output connected to a first node, and a second charge pump, having a second output connected to a second node, said first charge pump having a first current pumping capacity, and said second charge pump having a second current pumping capacity greater than said first current pumping capacity, and a controlled switch interposed between said first output and said second output, said switch comprising a first MOS transistor and a first driving element, said first MOS transistor having a first terminal connected to said first output of said first pump, a second terminal connected to said second output of said second pump, and a control terminal, said first driving element having an input receiving a control signal, an output connected to said control terminal of said first MOS transistor, and a supply input connected to said first output of said first pump.

2. The device of claim 1 wherein said controlled switch comprises a control terminal, and said device comprises a control unit having an output connected to said control terminal and generating a first level of a control signal controlling closure of said controlled switch, for charging said first node through said second charge pump.

3. The device of claim 2 wherein said control unit generates a second level of said control signal, controlling opening of said controlled switch, when the voltage at said second output must become smaller than the voltage at said first node.

4. The device of claim 1 wherein said first MOS transistor comprises a well region connected to said first output of said first pump.

5. The device of claim 1 wherein said switch comprises a second and a third MOS transistor and a second and a third driving element; said second MOS transistor having a first terminal and a well region connected to said first output of said first pump, a second terminal connected to a first terminal of said third MOS transistor, and a control terminal; said third MOS transistor having a second terminal and a well region connected to said second output of said second pump, and a control terminal; said second driving element having an input receiving a control signal, an output connected to said control terminal of said second MOS transistor, and a supply input connected to said first terminal of said second MOS transistor; said third driving element having an input connected to said input of said second driving element, an output connected to said control terminal of said third MOS transistor, and a supply input connected to said second terminal of said third MOS transistor.

6. The device of claim 1 further comprising a common phase generator connected to said first and second charge pumps.

7. The device of claim 6 wherein said common phase generator comprises a plurality of outputs supplying respective phase signals, and further wherein the device comprises at least a first plurality of driving circuits connected to said first charge pump, and a second plurality of driving circuits connected to said second charge pump, each output of said common phase generator being connected to a respective driving circuit of said first plurality of driving circuits, and to a respective driving circuit of said second plurality of driving circuits.

8. The device of claim 7 further comprising a first and a second plurality of enabling gates, the enabling gates of said first plurality of enabling gates having an enabling input receiving a first common enabling signal, and each being interposed between a respective output of said common phase generator, and a respective driving circuit of said first plurality of driving circuits, the enabling gates of said second plurality of enabling gates having an enabling input receiving a second common enabling signal, and each being interposed between a respective output of said common phase generator and a respective driving circuit of said second plurality of driving circuits.

9. The device of claim 6, further comprising a third charge pump connected to said common phase generator through a third plurality of enabling gates receiving a third enabling signal, and a third plurality of driving circuits.

10. A voltage pump architecture for an electronic device, comprising:

a first charge pump having a first current pumping capacity configured to drive a first output line having a high capacitive load;

a second charge pump having a higher current pumping capacity than the first current pumping capacity configured to drive a second output line;

a switch interposed between the first and second output lines to selectively connect and disconnect the first and second output lines together;

a control unit for controlling the switch, the control unit having an input terminal to receive control signals from the device and an output terminal connected to a control terminal on the switch;

a common phase generator having a first plurality of outputs supplying first phase signals to the first charge pump and a second plurality of outputs supplying second phase signals to the second charge pump; and a first plurality of driving circuits and a second plurality of driving circuits connected between the first and a second charge pumps, respectively, and the common phase generator.

11. The architecture of claim 10, further comprising a first plurality of enabling gates and a second plurality of enabling gates connected between the first and second driving circuits, respectively, and the common phase generator.

12. The architecture of claim 11, wherein the control unit further includes first and second enabling output signals for enabling, respectively, the first and second plurality of enabling gates.

13. The architecture of claim 12, further comprising a third charge pump connected to the common phase generator through a third plurality of enabling gates receiving a third enabling signal, and a third plurality of driving circuits.

14. An integrated electronic device comprising at least a first charge pump having a first output connected to a first node, and a second charge pump having a second output connected to a second node, said first charge pump having a first current pumping capacity, and said second charge pump having a second current pumping capacity greater than said first current pumping capacity, and a controlled switch interposed between the first output and the second output, the controlled switch comprising a first MOS transistor, a second MOS transistor, a first driving element, and a second driving element, the first MOS transistor having a first terminal and a well region connected to the first output of the first pump, a second terminal connected to a is first terminal of the second MOS transistor, and a control terminal, the second MOS transistor having a second terminal and a well region connected to the second output of the second pump, and a control terminal, the first driving element having an input receiving a control signal, an output connected to the first control terminal of the first MOS transistor, and a supply input connected to the first terminal of the first MOS transistor, and the second driving element having an input connected to the input of the first driving element, an output connected to the control terminal of the second MOS transistor, and a supply input connected to the second terminal of the second MOS transistor.

15. An integrated electronic device comprising at least a first charge pump having a first output connected to a first node, and a second charge pump having a second output connected to a second node, the first charge pump having a first current pumping capacity, and the second charge pump having a second current pumping capacity that is greater than the first current pumping capacity of the first charge pump, a controlled switch interposed between the first output and the second output, and a common phase generator connected to the first and second charge pumps, the common phase generator comprising a plurality of outputs supplying respective phase signals, and further comprising at least a first plurality of driving circuits connected to the first charge pump and a second plurality of driving circuits connected to the second charge pump, each output of the common phase generator being connected to a respective driving circuit of the first plurality of driving circuits and to a respective driving circuit of the second plurality of driving circuits.

16. An integrated electronic device comprising at least a first charge pump having a first output connected to a first node, and a second charge pump having a second output connected to a second node, the first charge pump having a first current pumping capacity, and the second charge pump having a second current pumping capacity that is greater than the first current pumping capacity of the first charge pump, a controlled switch interposed between the first output and the second output, and a common phase generator connected to the first and second charge pumps, the common phase generator comprising a plurality of outputs supplying respective phase signals, and further comprising at least a first plurality of driving circuits connected to the first charge pump and a second plurality of driving circuits connected to the second charge pump, each output of the common phase generator being connected to a respective driving circuit of the first plurality of driving circuits and to a respective driving circuit of the second plurality of driving circuits; and further comprising a first and a second plurality of enabling gates, the enabling gates of the first plurality of enabling gates having an enabling input receiving a first common enabling signal, each being interposed between a respective output of the common phase generator, and a respective driving circuit of the first plurality of driving circuits, the enabling gates of the second plurality of enabling gates having an enabling input receiving a second common enabling signal, and each being interposed between a respective output of the common phase generator and a respective driving circuit of the second plurality of driving circuits.

* * * * *

UNITED STATES PATENT AND TRADEMARK OFFICE
CERTIFICATE OF CORRECTION

PATENT NO. : 6,275,099 B1  Page 1 of 1
DATED : August 14, 2001
INVENTOR(S) : Andrea Ghilardelli It is certified that error appears in the above-identified patent and that said Letters Patent is hereby corrected as shown below:

<u>Column 7, claim 14,</u>
Line 29, "the first control terminal" should read -- the control terminal --.

Signed and Sealed this

Second Day of April, 2002

Attest:

JAMES E. ROGAN
Attesting Officer   Director of the United States Patent and Trademark Office